United States Patent [19]
Fujii et al.

[11] Patent Number: 6,126,752
[45] Date of Patent: *Oct. 3, 2000

[54] SEMICONDUCTOR DEVICE HAVING CAPACITOR AND MANUFACTURING APPARATUS THEREOF

[75] Inventors: Eiji Fujii; Yasuhiro Shimada; Yasuhiro Uemoto; Shinitirou Hayashi, all of Osaka; Tooru Nasu, Kyoto; Koichi Arita, Osaka; Atsuo Inoue, Kyoto; Akihiro Matsuda, Osaka; Masaki Kibe, Osaka; Tatsuo Ootsuki, Osaka, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/947,712

[22] Filed: Oct. 9, 1997

Related U.S. Application Data

[62] Division of application No. 08/778,953, Jan. 6, 1997, Pat. No. 5,717,233, which is a continuation of application No. 08/507,657, Jul. 25, 1995, abandoned, which is a continuation of application No. 08/076,574, Jun. 14, 1993, abandoned.

[30] Foreign Application Priority Data

| | | | |
|---|---|---|---|
| Jun. 12, 1992 | [JP] | Japan | 4-153256 |
| Jul. 6, 1992 | [JP] | Japan | 4-178044 |
| Oct. 2, 1992 | [JP] | Japan | 4-264546 |
| Oct. 2, 1992 | [JP] | Japan | 4-264547 |
| Oct. 16, 1992 | [JP] | Japan | 4-278381 |
| Oct. 16, 1992 | [JP] | Japan | 4-288551 |
| Oct. 29, 1992 | [JP] | Japan | 4-291065 |
| Oct. 29, 1992 | [JP] | Japan | 4-291066 |
| Nov. 20, 1992 | [JP] | Japan | 4-311576 |
| Feb. 12, 1993 | [JP] | Japan | 5-23933 |

[51] Int. Cl.$^7$ ............................ B05B 5/057
[52] U.S. Cl. ............ 118/620; 118/621; 118/627; 118/50; 118/50.1; 118/608; 118/612; 118/308; 204/622
[58] Field of Search ............ 118/626, 627, 118/308, 600, 612, 621, 723 R, 723 E, 50, 50.1, 620, 608; 427/180, 79, 473, 474, 475; 204/622

[56] References Cited

U.S. PATENT DOCUMENTS

| | | | |
|---|---|---|---|
| 3,000,752 | 9/1961 | Jackson et al. | 118/634 |
| 3,888,207 | 6/1975 | Stutz et al. | 118/627 |
| 3,913,523 | 10/1975 | Probst et al. | 118/626 |
| 3,991,710 | 11/1976 | Gourdine et al. | 118/627 |
| 4,170,193 | 10/1979 | Scholes et al. | 118/627 |
| 5,032,422 | 7/1991 | Lamirand et al. | 118/627 |

*Primary Examiner*—Laura Edwards
*Attorney, Agent, or Firm*—Amster, Rothstein & Ebenstein

[57] ABSTRACT

A semiconductor device comprising an integrated circuit and a capacitor. In this capacitor, a bottom electrode, a dielectric film and a top electrode are formed, independently of the integrated circuit, on the interlayer insulating film, and the top electrode and bottom electrode are connected with metal interconnections through contact holes opened in the protective film for protecting the surface of the capacitor. In this constitution, either the top electrode or the bottom electrode is connected the bias line of the integrated circuit, and the other is connected to the ground line, so that extraneous emission may be reduced without having to connect the capacitor outside.

12 Claims, 7 Drawing Sheets

SEMICONDUCTOR DEVICE HAVING CAPACITOR AND MANUFACTURING APPARATUS THEREOF

This is a divisional of application Ser. No. 08/778,953 filed on Jan. 6, 1997, now U.S. Pat. No. 5,717,233 which is a continuation of application Ser. No. 08/507,657 filed on Jul. 25, 1995, now abandoned, which was a continuation of application Ser. No. 08/076,574 filed on Jun. 14, 1993, now abandoned.

FIELD OF THE INVENTION

The present invention relates to a semiconductor device having capacitor employing a dielectric film and its manufacturing method.

BACKGROUND OF THE INVENTION

Recently, in the trend of higher speed and lower power consumption of semiconductor devices such as microcomputer and digital signal processor, the consumer electronic appliances are becoming higher and higher in Performance, while extraneous emission such as the electromagnetic noise generated from these electronic appliances is posing serious problems. Accordingly, measures against extraneous emission are being demanded not only in electronic appliances but also in semiconductor devices used in them. The most effective measure against extraneous emission in semiconductor device is to install a capacitor of large capacity between the bias line and ground line, and hitherto a capacitor was connected outside of the semiconductor device.

On the other hand, lately, nonvolatile random access memory in simple constitution comprising a capacitor using a ferroelectric film, and dynamic random access memory using a capacitor made of dielectric film of high dielectric constant as a holding capacity are being developed.

Figure 1:
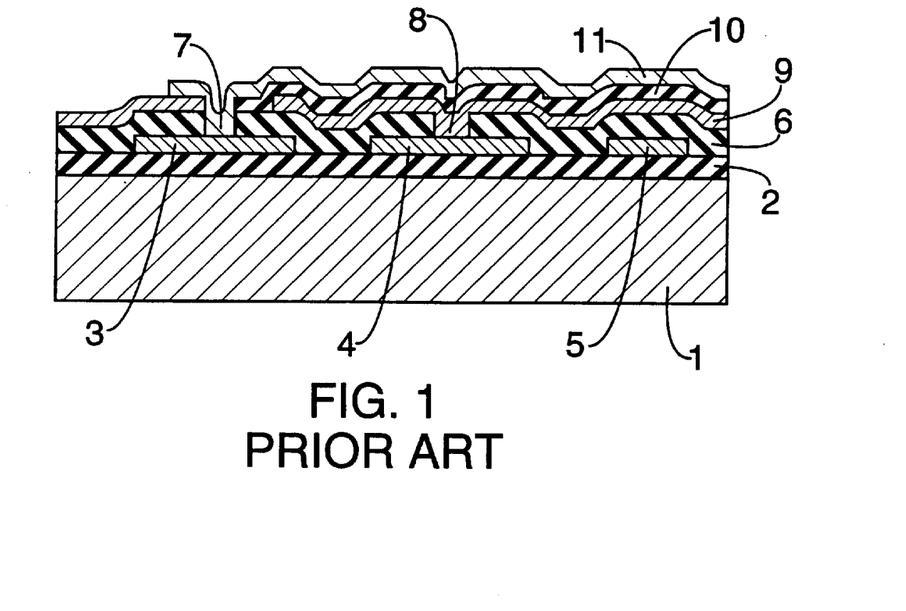
FIG. 1 is a partially sectional view showing the structure of essential parts of a conventional semiconductor device having capacitor.

A conventional semiconductor device having capacitor is view of a representative semiconductor device. In FIG. 1, reference number 1 denotes a semiconductor substrate, and the integrated circuit formed on the semiconductor substrate 1 is omitted in the drawing. An insulating film 2 is formed on the semiconductor substrate 1. On the insulating film 2, metal interconnections 3, 4, 5 made of aluminum or aluminum alloy are formed. On these metal interconnections 3, 4, 5, an insulating film 6 is formed, and a bottom electrode 9, a ferroelectric film 10, and a top electrode 11 are formed on the insulating film 6, and the bottom electrode 9 is connected to the metal interconnection 4 through a contact hole 8, and the top electrode 10 to the metal interconnection 3 through a contact hole 7.

In FIG. 1, supposing the metal interconnection 3 to be bias line Vss and the metal interconnection 4 to be bias line Vdd, a capacitor comprising the bottom electrode 9, ferroelectric film 10 and top electrode 11 is inserted between the bias line Vss and bias line Vdd.

A manufacturing method of the conventional semiconductor device having capacitor shown in FIG. 1 is described below. On the insulating film 2 on the semiconductor substrate 1 on which integrated circuits and others are formed, a metal film of aluminum or aluminum alloy is formed by sputtering or other method. This metal film is etched by ordinary photoetching method, and the metal interconnections 3, 4, 5 are formed. Consequently, on the entire surface of the semiconductor substrate 1, the insulating film 6 is formed by CVD method, and the contact holes 7, 8 are formed in specified areas of the insulating film 6 by photoetching method. A metal film is then formed on the insulating film 6, and this metal film is photoetched to form the bottom electrode 9. Including the upper part of the bottom electrode 9, the ferroelectric film 10 is formed by sputtering. After removing the ferroelectric film 10 in the contact hole 7, an aluminum film or aluminum alloy film is formed, and the top electrode 11 is formed by photoetching.

In such conventional semiconductor device having capacitor, however, since the ferroelectric film 10 is formed in the contact state of the bottom electrode 9 with the metal interconnection 4 of the integrated circuit, it is required that the material of the bottom electrode 9 should not react with the metal interconnection 4 at the time of heat treatment of the ferroelectric film 10, and that the insulating film 6 and the ferroelectric film 10 should adhere firmly to each other. It is, actually, difficult to select the material that satisfies these conditions. For example, when aluminum is used for the metal interconnections 3, 4, 5, and aluminum is also used for the bottom electrode 9, matching is excellent in their mutual relation and adhesion with the insulating film 6, but when oxide ferroelectric material such as $BaTiO_3$ and PZT is used as the ferroelectric film 10, aluminum and the ferroelectric film 10 react with each other, which causes to vary the capacity of the capacitor.

Besides, in such conventional semiconductor device having capacitor, the metal interconnections 3, 4, 5 have been already formed when forming the ferroelectric film 10, and a part of the metal interconnections 3, 4, 5 is contacting with the diffusion layer (not shown in FIG. 1) of the semiconductor substrate 1, and therefore the ferroelectric film 10 cannot be treated at high temperature. That is, when the metal interconnections 3, 4, 5 are aluminum and the semiconductor substrate 1 is a silicon substrate, when heated at 450° C. or higher, aluminum may invade into the diffusion layer in spikes to penetrate through the diffusion layer.

In the conventional semiconductor device having capacitor, moreover, after forming the contact holes 7 and 8 simultaneously on the insulating film 6, the bottom electrode 9 is formed, and then ferroelectric film 10 is formed thereon. Therefore, at the time of heat treatment of ferroelectric film 10, the reaction product due to reaction between ferroelectric film 10 and metal interconnection 3 is formed in the bottom of the contact hole 7. This reaction product is left over also when removing the ferroelectric film 10, which may cause contact failure between the metal interconnection 3 and top electrode 11.

On the other hand, in the method of first forming the contact hole 8 then forming the contact hole 7 after forming the ferroelectric film 10, both ferroelectric film 10 and insulating film 6 must be etched, but the etchant satisfying the both etching conditions differs, and the process is complicated.

SUMMARY OF THE INVENTION

It is hence a primary object of the invention to present a semiconductor device having capacitor with high reliability. It is another object of the invention to present a method for manufacturing the semiconductor device without deteriorating the integrated circuit formed on the substrate.

In the semiconductor device of the invention, a capacitor made of bottom electrode, dielectric film, and top electrode is formed on an insulating film of an integrated circuit, and the top electrode and bottom electrode of this capacitor are connected with the metal interconnections of the integrated circuit through the contact holes provided in a protective film formed to cover the capacitor.

According to this constitution, since the capacitor is formed in a state independent from the integrated circuit, the bottom electrode may be made of an optimum material selected in the relation with the dielectric film and the insulating film beneath the bottom electrode. Therefore, a favorable capacitor being small in fluctuation of the capacity may be formed.

Besides, since the manufacturing process of capacitor including the heat treatment of dielectric film is conducted in the state in which the integrated circuit is already formed on the substrate but the metal interconnections are not formed yet, the dielectric film can be heated at a sufficiently high temperature, and a dielectric film with a large dielectric constant may be formed.

Also in the constitution of the invention, the first contact hole provided in the insulating film formed on the substrate and the second contact hole provided on the insulating film formed to protect the capacitor can be formed, and the metal interconnections can be formed right after forming the contact holes, the inside of the contact holes will not be contaminated, and a favorable electric contact may be easily realized. Before forming the first and second contact holes, the dielectric film is formed in a pattern, and therefore the contact holes can be formed by etching the nitride film or oxide film used in the ordinary semiconductor device, so that the manufacturing process is not complicated.

DESCRIPTION OF THE PREFERRED EMBODIMENTS

Embodiment 1

Figure 2:
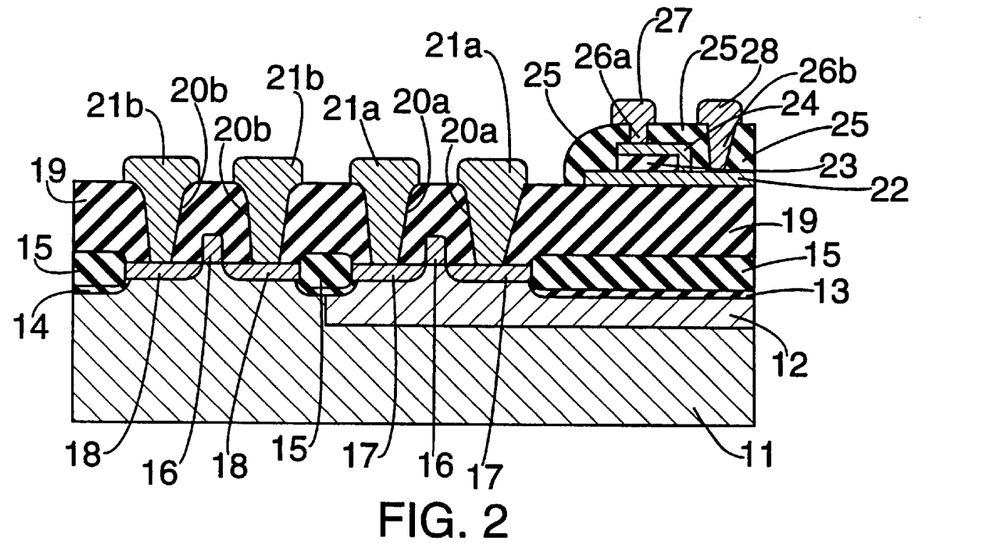
FIG. 2 is a partially sectional view showing the structure of essential parts of a semiconductor device having capacitor in Embodiment 1 of the invention.

In FIG. 2, reference number 11 is an N-type silicon substrate, and on this N-type silicon,substrate 11 are formed a P-type well 12, an isolation region 13 for isolating circuit elements in the P-type well 12, an isolation region 14 for isolating circuit elements in the silicon substrate 11, an isolating oxide film 15 composed of a thick silicon oxide film, a gate electrode 16, and an N-type diffusion layer 17 and a P-type diffusion layer 18 forming a transistor.

Reference number 19 is an interlayer insulating film composed of silicon oxide film or the like formed on the Ntype silicon substrate 11, and contact holes 20a, 20b are formed in this interlayer insulating film 19. On the interlayer insulating film. 19, metal interconnections 21a, 21b made of aluminum or aluminum alloy are formed through the contact holes 20a, 20b, and they are connected to the N-type diffusion layer 17 and P-type diffusion layer 18.

On the interlayer insulating film 19 is formed a capacitor composed of a bottom electrode 22 such as platinum film, a dielectric film 23 possessing a high dielectric constant such as $Ba_{1-x}Sr_xTiO_3$ ($0 \leq X \leq 1$), and a top electrode 24 of platinum or the like, and a protective film 25 such as silicon oxide film and silicon nitride film is formed on this capacitor.

On the protective film 25 of the capacitor, contact holes 26a, 26b are formed, and metal interconnections 27, 28 made of aluminum or aluminum alloy to be connected with the top electrode 24 and bottom electrode 22 respectively through contact holes 26a, 26b are formed on the protective film 25.

According to such constitution of Embodiment 1, the capacitor is formed on the interlayer insulating film 19 independently of the integrated circuit formed on the silicon substrate 11, and after heat treatment of the dielectric film 23, the metal interconnections 21a, 21b, 27 and 28 are formed, and therefore the material for the bottom electrode 22 may be selected from a wide range. That is, the material for the bottom electrode 22 may be selected only in the relation with the interlayer insulating film 19 and dielectric film 23. Moreover, since the dielectric film 23 is heated before the metal interconnections 21a, 21b, 27 and 28 are formed, the dielectric film 23 can be treated at a higher temperature than the alloy temperature of aluminum and silicon. Therefore, as compared with the prior art, the dielectric film 23 excellent in electric characteristics may be obtained.

Furthermore, since the metal interconnections 21a, 21b, 27 and 28 are formed after heat treatment of the dielectric film 23, the temperature of heat treatment for improving the interface of the metal interconnection 21a and N-type diffusion layer 17 and the interface between the metal interconnection 21b and the P-type diffusion layer 18 may be same as in the manufacturing condition of ordinary integrated circuit (450° C. or less), and the process supplemented in order to incorporate the capacitor will not deteriorate the integrated circuit.

Embodiment 2

Figure 3:
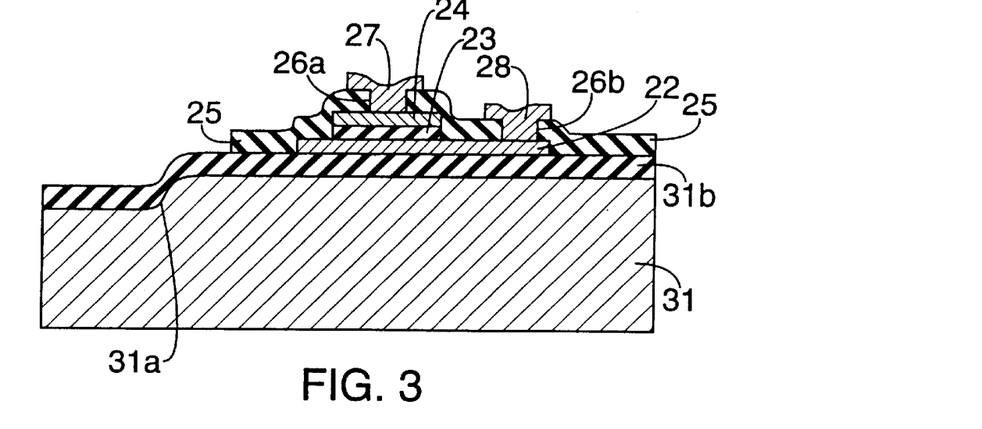
FIG. 3 is a partially sectional view showing the structure of a capacitor of a semiconductor device in Embodiment 2 of the invention, in which the end of the top electrode of this semiconductor is formed at a position distant from the end of the bottom electrode.
Figure 4:
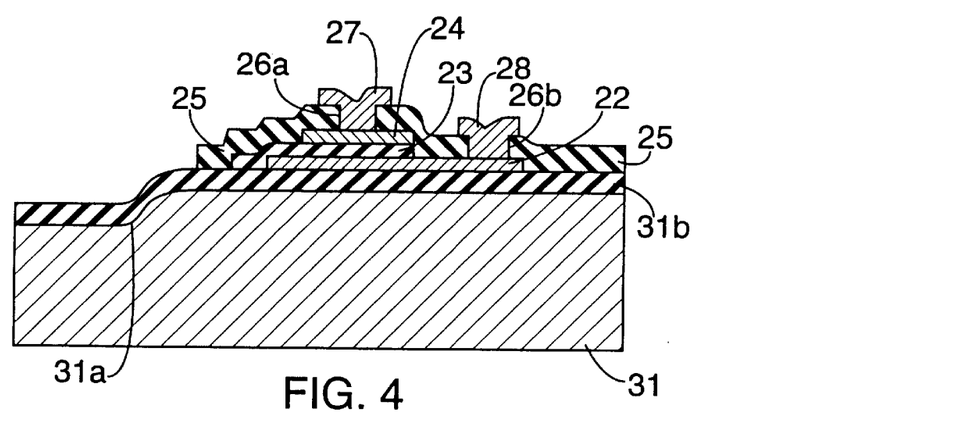
FIG. 4 is a Partially sectional view showing the structure of a capacitor of a semiconductor device modified from Embodiment 2, in which the dielectric film of this semiconductor device is formed beyond the end of the bottom electrode.
Figure 5:
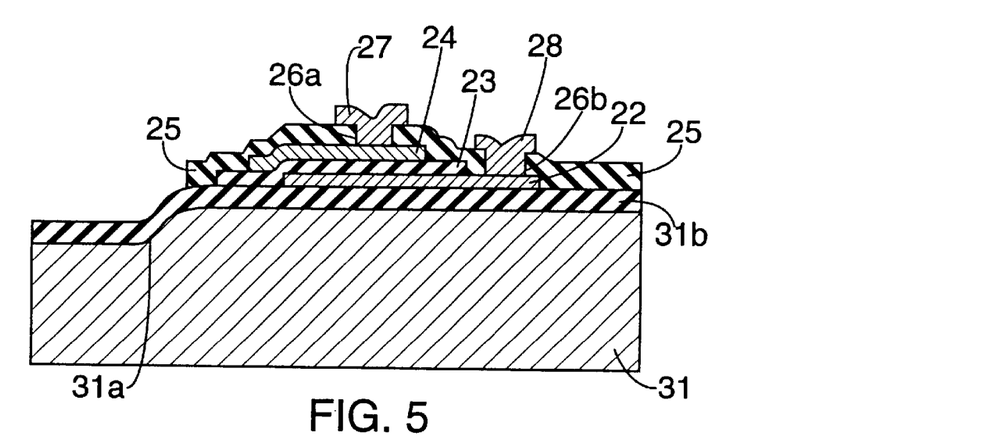
FIG. 5 is a partially sectional view showing the structure of a capacitor of other semiconductor device modified from Embodiment 2, in which the end of the top electrode of this semiconductor device is located between the slope part in the step of the substrate and the end of the bottom electrode.

In FIGS. 3, 4 and 5, transistors and other circuit elements for composing the integrated circuits are formed on a silicon substrate 31 aside from the capacitor, but the transistors and other parts not related directly with the explanation of Embodiment 2 and its modified semiconductor devices are not shown in the drawings. The silicon substrate 31 has a step 31a which is formed in the process of forming the integrated circuit, and an interlayer insulating film 31b such as silicon oxide film is formed on the surface of the silicon substrate 31. The capacitor is formed on this interlayer insulating film 31b.

The capacitor is composed of a bottom electrode 22 such as platinum film, a dielectric film 23 possessing a high dielectric constant such as $Ba_{1-x}Sr_xTiO_3$ ($0 \leq X \leq 1$), and a top electrode 24 such as platinum film. On the surface of the capacitor is formed a protective film 25 such as silicon oxide film and silicon nitride film.

Contact holes 26a, 26b are formed in the protective film 25 of the capacitor, and metal interconnections 27 and 28 made of aluminum or aluminum alloy to be connected to the top electrode 24 and bottom electrode 22 respectively are formed in the contact holes 26a, 26b.

The details of these structures are explained sequentially below while referring to FIGS. 3, 4 and 5.

As shown in FIGS. 3, 4 and 5, in any structure, it is configured so that the end of the bottom electrode 22 and the end of the top electrode 24 may be at distant positions. By thus composing, stress due to thermal expansion of the bottom electrode and top electrode 24 generated at the time of heat treatment of the dielectric film 23 is dispersed and lessened, and cracking of the dielectric film 23 and interlayer insulating film 31b can be prevented, so that the reliability may be improved.

Besides, as shown in FIG. 4, in the constitution in which the dielectric film 23 is formed beyond the end of the bottom electrode 22, although the manufacturing method is more complicated than in the constitution shown in FIG. 3, it brings about an effect of decreasing the current leak at the end of the dielectric film 23 as compared with the constitution shown in FIG. 3.

Moreover, as shown in FIG. 5, sequentially from the step 31a of the silicon substrate 31, by disposing the end of the dielectric film 23, the end of the top electrode 24, and the end of the bottom electrode 22, the stress concentration in heat treatment of the dielectric film 23 can be alleviated.

Embodiment 3

Figure 6:
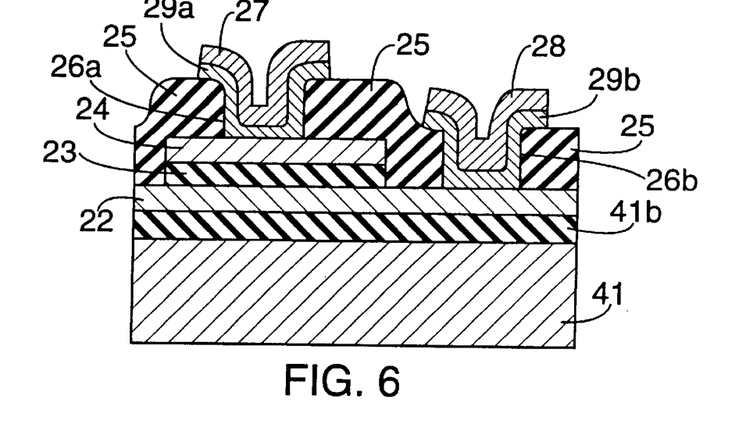
FIG. 6 is a partially sectional view showing the structure of a capacitor of a semiconductor device in Embodiment 3 of the invention, in which the top electrode and metal interconnections of the semiconductor device are connected through a conductive film mainly composed of titanium being formed as containing contact holes.
Figure 7:
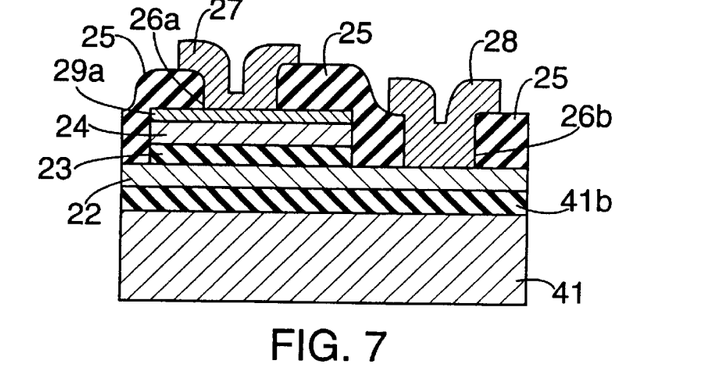
FIG. 7 is a sectional view showing the structure of a capacitor of a semiconductor device modified from Embodiment 3, in which the top electrode and metal interconnections are connected through a conductive film mainly composed of titanium being formed on the top electrode.

In FIGS. 6 and 7, transistors and other circuit elements for composing the integrated circuits are formed on a silicon substrate 41 aside from the capacitor, but the other parts not related directly with the explanation of Embodiment 3 and its modified semiconductor devices are not shown in the drawings. The silicon substrate 41 has an interlayer insulating film 41b such as silicon oxide film formed thereon, and a capacitor is formed on this interlayer insulating film 41b. The capacitor is composed of a bottom electrode 22 such as platinum film, a dielectric film 23 possessing a high dielectric constant such as $Ba_{1-x}Sr_xTiO_3$ ($0 \leq X \leq 1$), and a top electrode 24 such as platinum film. On the surface of the capacitor is formed a protective film 25 such as silicon oxide film and silicon nitride film.

Contact holes 26a, 26b are formed in the protective film 25 of the capacitor, and through these contact holes 26a, 26b, the top electrode 24 and bottom electrode 22, and metal interconnections 27 and 28 made of aluminum or aluminum alloy are connected mutually through conductive films 29a and 29b mainly composed of titanium.

In the constitution shown in FIG. 6, the conductive film 29a, 29b mainly composed of titanium are formed on the protective film 25 including the contact holes 26a, 26b, and through these conductive films 29a, 29b, the metal interconnection 27 is connected to the top electrode 24 and the metal interconnection 28 to the bottom electrode 22. By thus composing, at the time of heat treatment of the metal interconnections after forming the metal interconnections 27 and 28, the reaction between the metal interconnections 27, 28 and the top electrode 24 and bottom electrode 22 can be prevented by the conductive films 29a, 29b mainly composed of titanium, so that the reliability may be improved, and at the same time the materials for the top electrode 24 and bottom electrode 22 can be selected from a wider range.

In the constitution shown in FIG. 7, moreover, the conductive film 29a mainly composed of titanium is formed on the top electrode 24, and the metal interconnection 27 is connected to the top electrode 24 through the conductive film 29a, and the metal interconnection 28 is directly connected to the bottom electrode 22. In such constitution, since the conductive film 29a mainly composed of titanium adheres tightly with the top electrode 24 and protective film 25, separation does not occur between the top electrode 24 and protective film 25 in heat treatment of the dielectric film 23 or in heat treatment of the metal interconnections 27, 28.

Embodiment 4

Figure 8:
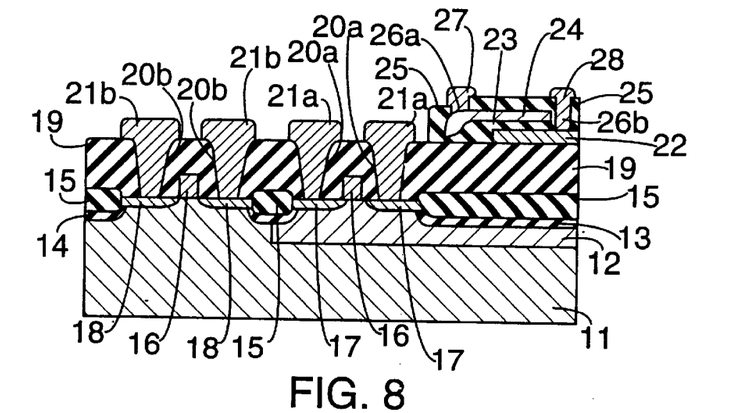
FIG. 8 is a partially sectional view showing the structure of a semiconductor device in Embodiment 4 of the invention, in which the contact hole leading to the top electrode formed on the insulating film for protecting the capacitor is formed at a position not overlapping with the bottom electrode.

FIG. 8 shows a semiconductor device modified from Embodiment 1.

In FIG. 8, the same parts as in Embodiment 1 shown in FIG. 2 are identified with same reference numbers and their explanations are omitted. A capacitor is formed on the interlayer insulating film 19, and in this case the dielectric film 23 and the top electrode 24 are formed beyond the end of the bottom electrode 22. Furthermore, to connect the top electrode 24 and metal interconnection 27, a contact hole 26a provided in the protective film 25 of the capacitor is formed at a position not overlapping with the bottom electrode 22. The capacitor is formed in an overlapped region of the bottom electrode 22 and top electrode 24 through dielectric film 23, and therefore effects applied on the capacitor when forming the contact holes 26a, 26b and top electrode 27 are small, and the reliability is improved.

Embodiment 5

FIGS. 9 through 16 are drawings to explain an example of manufacturing method of semiconductor device having capacitor according to the invention.

Figure 9:
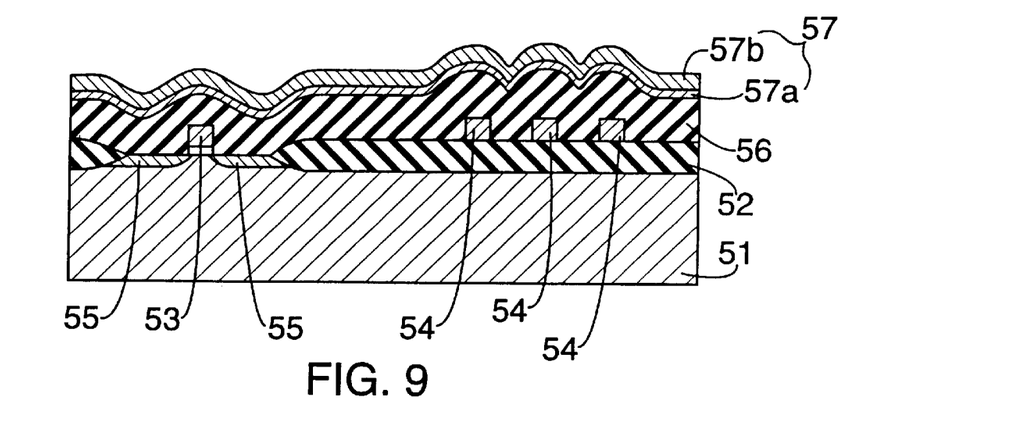
FIG. 9 through FIG. 16 are partially sectional views showing a manufacturing method of a semiconductor device having capacitor in the invention, FIG. 9 being a diagram showing the state of forming a conductive film as bottom electrode, FIG. 10 showing the state of forming the dielectric film, FIG. 11 showing the state of forming a conductive film as top electrode, FIG. 12 showing the state of forming the top electrode and dielectric film, FIG. 13 showing the state of forming the bottom electrode and the state of removing the residue of the dielectric film, FIG. 14 showing the state of forming a protective film for protecting the capacitor, FIG. 15 showing the state of forming contact holes in the protective film and interlayer insulating film, and FIG. 16 showing the state of forming the metal interconnections.

As shown in FIG. 9, on a silicon substrate 51 are formed an isolating oxide film 52 composed of a thick silicon oxide film for isolating a transistor region, a gate electrode 53 composed of polycrystalline silicon film, a conductor wiring 54 composed of polycrystalline silicon film, a diffusion layer 55, and an interlayer insulating film 56 composed of silicon oxide film. The surface of the interlayer insulating film 56 is undulated due to effects of the gate electrode 53 and conductor wiring 54 formed beneath the interlayer insulating film 56. On thus composed interlayer insulating film 56 of the integrated circuit, a multilayer film consisting of a titanium film 57a and a platinum film 57b is formed as a bottom electrode 57.

Figure 10:
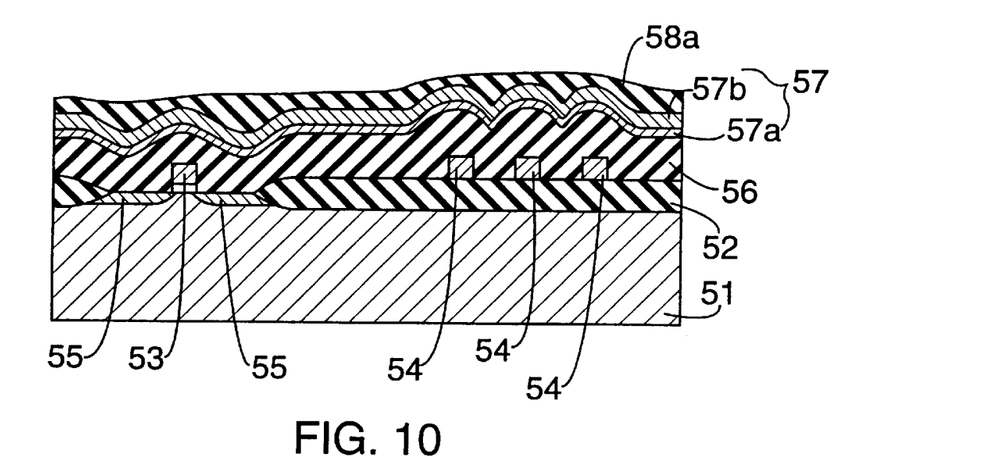

Next, as shown in FIG. 10, on the entire surface of the silicon substrate 51, a dielectric film 58a possessing a high dielectric constant such as $Ba_{1-x}Sr_xTiO_3$ ($0 \leq X \leq 1$) is coated by means known in the art, and is heated.

Figure 11:
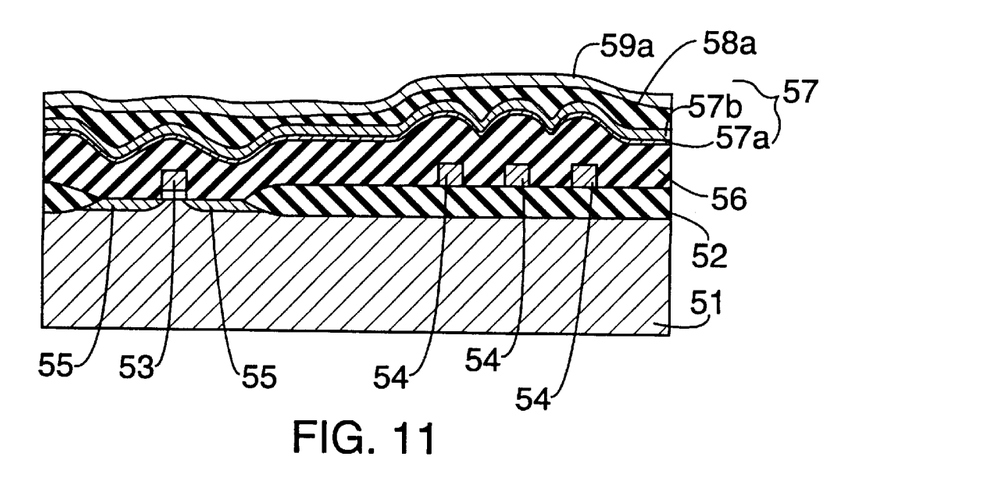

Consequently, as shown in FIG. 11, on the entire upper surface of the dielectric film 58a, a platinum film 59a is formed as a top electrode 59.

Figure 12:
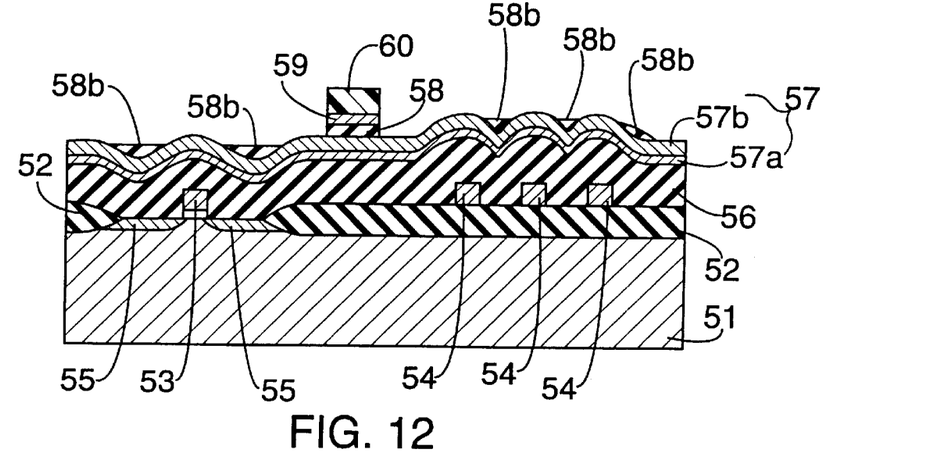

Then, as shown in FIG. 12, a resist pattern 60 is formed on the platinum film 59a, and using this resist pattern 60 as mask, the platinum film 59a and dielectric film 58a are etched sequentially, and the top electrode 59 and dielectric film 58 are formed. At this time, the residue 58b of the dielectric film 58 is often left over in the recess of the interlayer insulating film 56 on platinum film 57b, and when this residue 58b is left over, contact failure may occur when forming contact holes 64a, 64b in a later process.

Figure 13:
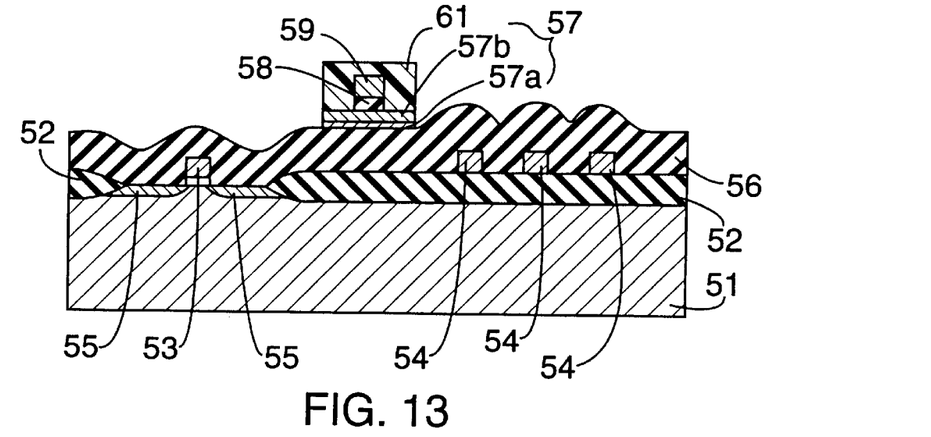

After removing the resist pattern 60, as shown in FIG. 13, a resist pattern 61 is newly formed on the platinum electrode 57b so as to cover the capacitor, and the platinum film 57b and titanium film 57a are etched by using this resist pattern 61 as mask, thereby forming the bottom electrode 57. Further using the resist pattern 61 as mask, the residue 58b of the dielectric film 58a is removed.

Figure 14:
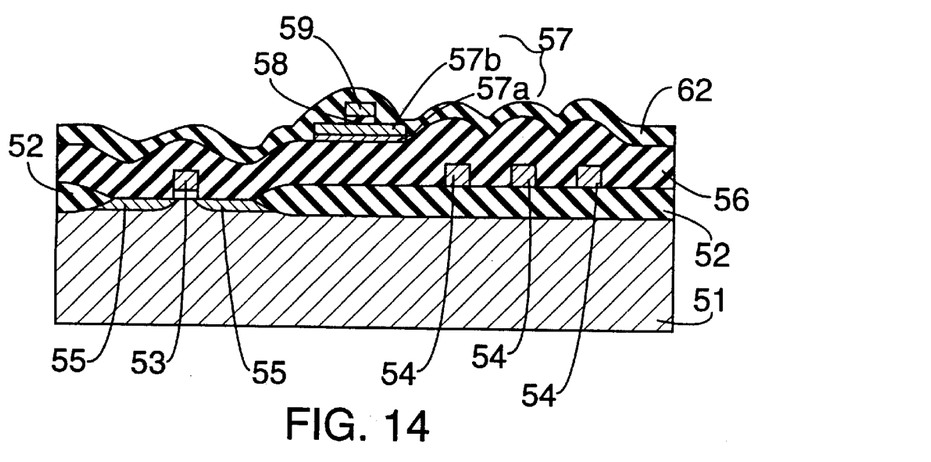

After removing the resist pattern 61, as shown in FIG. 14, a Protective film 62 is formed on the entire upper surface of the silicon substrate 51.

Figure 15:
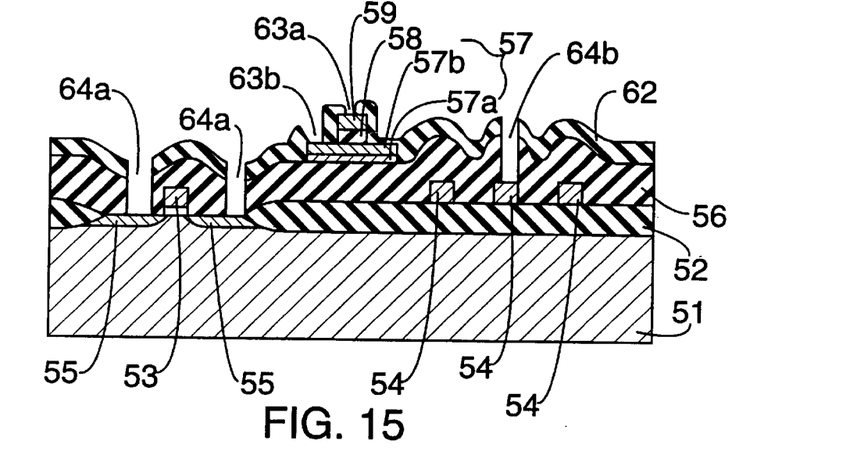

Successively, as shown in FIG. 15, in the protective film 62 on the capacitor, a contact hole 63a leading to the top electrode 59 and a contact hole 63b leading to the bottom electrode 57 are formed, and in the protective film 62 and interlayer insulating film 56 in the region other than the capacitor, a contact hole 64a leading to the diffusion layer 55 and a contact hole 64b leading to the conductor wiring 54 are formed, respectively. The contact holes 63a, 63b, and the contact holes 64a, 64b may be formed simultaneously in the same process, or in different processes.

Figure 16:
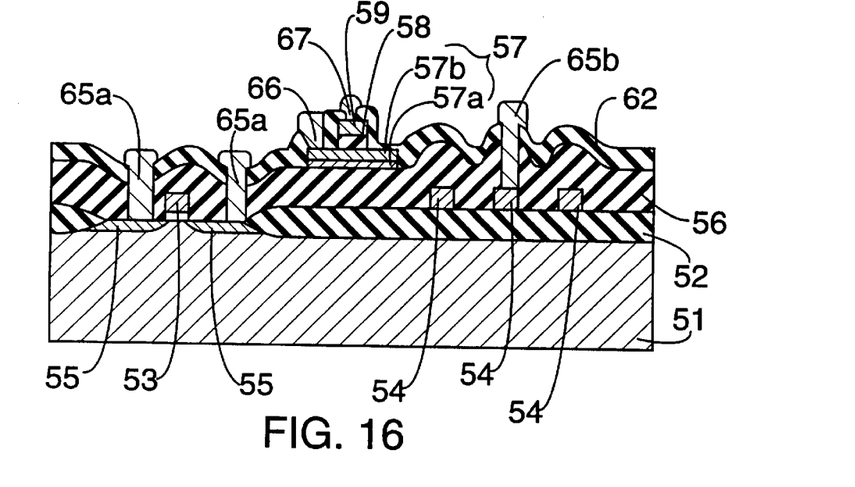

As shown in FIG. 16, next, an aluminum film or an aluminum alloy film is formed on the entire surface of the silicon substrate 51, and the metal interconnections 65a, 65b, 66 and 67 are formed in the ordinary photoetching process.

Incidentally, the process for removing the residue 58b explained in FIG. 13 may be omitted if the residue 58b has been sufficiently removed in the process in FIG. 12.

In this embodiment, the titanium film 57a and platinum film 57b for the bottom electrode 57, the dielectric film 58a, and the platinum 59a for the top electrode 59 are preliminarily laminated, then the top electrode 59 and dielectric film 58 are formed, and finally the bottom electrode 57 is formed, but a capacitor of similar quality can be formed by varying the sequence of manufacturing process as follows.

First, on the interlayer insulating film 56 of the silicon substrate 51, a multilayer film consisting of titanium film 57a and platinum film 57b to compose the bottom layer 57 is formed. On this multilayer film, a first resist pattern is formed, and using this first resist pattern as mask, the multilayer film is etched, and the bottom electrode 57 is formed. Next, after removing the first resist pattern, the dielectric film 58a and the platinum film 59a for forming the top electrode 59 are formed sequentially on the silicon substrate 51. A second resist pattern is formed on the platinum film 59a, and using this second resist pattern as mask, the Platinum film 59a and dielectric film 58a are etched, and the top electrode 59 and dielectric film 58 are formed. After removing the second resist pattern, the protective film 62 is formed on the entire surface. On this protective film 62, a third resist pattern for covering the entire capacitor is formed, and using this third resist pattern as mask, the residue 58b of the dielectric film 58 left over in the other regions than the capacitor is removed. After removing the third resist pattern, contact holes 63a, 63b, 64a, 64b are formed in the protective film 62 and interlayer insulating film 56. Consequently, on the entire surface of the silicon substrate 51, an aluminum film or an alloy film mainly composed of aluminum is formed, and the metal interconnections 65a, 65b, 66 and 67 are formed by ordinary photoetching process.

Embodiment 6

Figure 17:
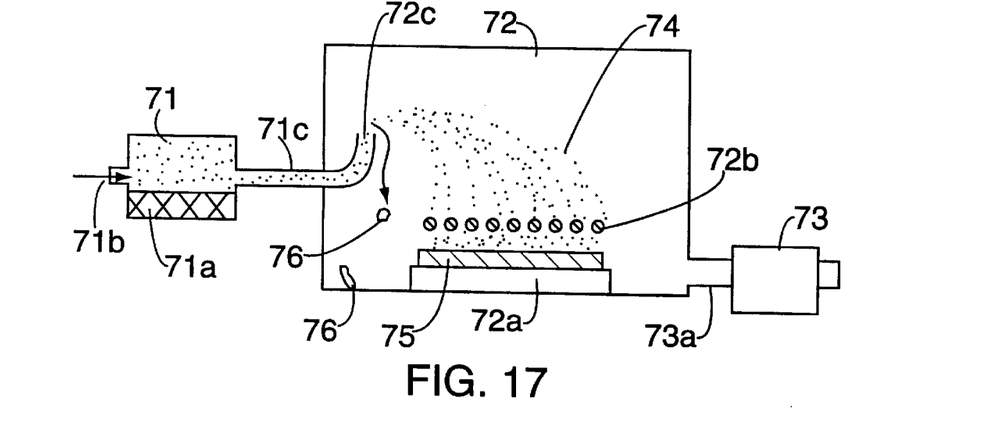
FIG. 17 is a schematic diagram of a forming apparatus of dielectric film in the manufacturing method of semiconductor device having capacitor of the invention.

FIG. 17 is a schematic diagram of a dielectric film forming apparatus in an embodiment of the invention, and this dielectric film forming apparatus is explained herein, together with the forming method of dielectric film in individual embodiments.

In FIG. 17, reference number 71 is a pulverization chamber, 72 is a film growth chamber, 73 is an exhaust pump, and 74 is particulates. The pulverization chamber 71 comprises means 71a for pulverizing the material for composing the dielectric film, and a gas feed port 71b for feeding carrier gas. The pulverization chamber 71 and film growth chamber 72 are connected with a pipe 71c for feeding particulates 74 into the film growth chamber 72 together with carrier gas. The film growth chamber 72 comprises a substrate holder 72a for holding the substrate 75, a grid electrode 72b disposed above the substrate holder 72a, and an injection port 72c for injecting particulates 74 into the film growth chamber 72. The film growth chamber 71 and exhaust pump 73 are connected with an exhaust pipe 73a.

In growing a dielectric film by using the dielectric film forming apparatus, the particulates 74 produced in the pulverization chamber 71 are injected into the film growth chamber 72 reduced in pressure by the exhaust pump 73 through the injection port 72c. The particulates 74, when pulverized by the pulverization chamber 71 and when injected from the injection port 72c, are mostly charged electrically by the collision and mutual friction. It is more effective, incidentally, when charged by force by installing an electrode for charging. The grid electrode 72b is charged with reverse electric potential of the electric charge of the particulates 74, and by this electric potential, the injected particulates 74 are attracted to the substrate 75 side. The particulates 74 passing through the grid electrodes 72b reach the substrate 75, and a dielectric film is formed. Since the particulates 74 are accelerated by the electric field, the kinetic energy is large, and they move and dissipate on the surface after reaching the substrate 75, so that a dielectric film is also formed in the undulated part of the surface of the substrate 75.

In the dielectric film growth apparatus in the embodiment, since high voltage is not directly applied on the substrate 75, if the substrate is a semiconductor substrate on which an integrated circuit is formed and when forming a dielectric film thereon, there is no risk of breakdown of the integrated circuit by application of high voltage.

Besides, by controlling the direction of the injection port 72c, a distance between injection port 72c and substrate 75, and voltage applied to the grid electrodes 72b, coarse particulates 76 are dropped before attracted to the grid electrodes 72b, and only fine particulates 74 can reach the substrate 75.

In this way, the dielectric film can be formed on the undulated part of the surface of the substrate 75, and deposit of coarse particulates 76 on the substrate 75 can be prevented, and by heat treatment of this dielectric film, the dielectric film small in defects and excellent in electric characteristics can be obtained.

In other known method for forming the dielectric film, a sol-gel liquid composed of metal alkoxide containing the metal for composing the dielectric film, or a metal-organic solution containing the metal for composing the dielectric film is coated, and this coated film is heated in oxidizing atmospheric gas, while irradiating with ultraviolet rays. although the performance of the obtained dielectric film is inferior as compared with the performance of the dielectric film of embodiment 6, this method does not require any special equipment, and is good for mass production. Therefore this method may be suited depending on the required performance of the dielectric film and cost performance.

In this invention, too, various modifications are possible in addition to the embodiments illustrated so far. For example, Embodiments 1 through 4 relate to examples of using silicon substrates on which integrated circuits are formed, but, for example, in the substrates composed of III–V compound or II–VI compound, or in insulated substrates on which thin film devices are formed, the capacitor exactly in the same structure may be formed as well.

In Embodiments 1 through 4, platinum films are used as the bottom electrode and top electrode, but other materials may be similarly used, including metal films having high melting point such as palladium, tungsten, tantalum, titanium, nickel and chromium, their alloy films, their silicide films, oxide conductive films such as indium tin oxide (ITO) and rhenium oxide, nitride conductive films such as titanium nitride, and their laminate films.

As the dielectric film in Embodiments 1 through 4, $Ba_{1-x}Sr_xTiO_3$ ($0 \leq X \leq 1$) is used, but other materials may be similarly used, including lead titanate, PZT ($PbZr_{1-x}Ti_xO_3$), PLZT ($Pb_{1-y}La_yZr_{1-x}Ti_xO_3$), bismuth titanate, tantalum oxide, other dielectric materials and ferroelectric materials.

Meanwhile, in Embodiments 1 through 4, by forming an amorphous layer of relatively high electric resistance on the surface of the top electrode side of the dielectric film, a capacitor of low leak current and high insulation breakdown voltage is realized. To form this amorphous layer, after forming the dielectric film, the pulse light of excimer laser is irradiated to the surface of the dielectric film, and the surface layer is instantly melted and cooled quickly.

In Embodiments 1 through 4, by connecting either the top electrode or the bottom electrode to the bias line of the integrated circuit and connecting the other to the ground line of the integrated circuit, a capacitor of several nanofarads or more can be easily inserted between the bias line and ground line. Therefore, the transient current component flowing in the bias line can be suppressed nearly to zero, so that the extraneous emission may be notably reduced.

Figure 18:
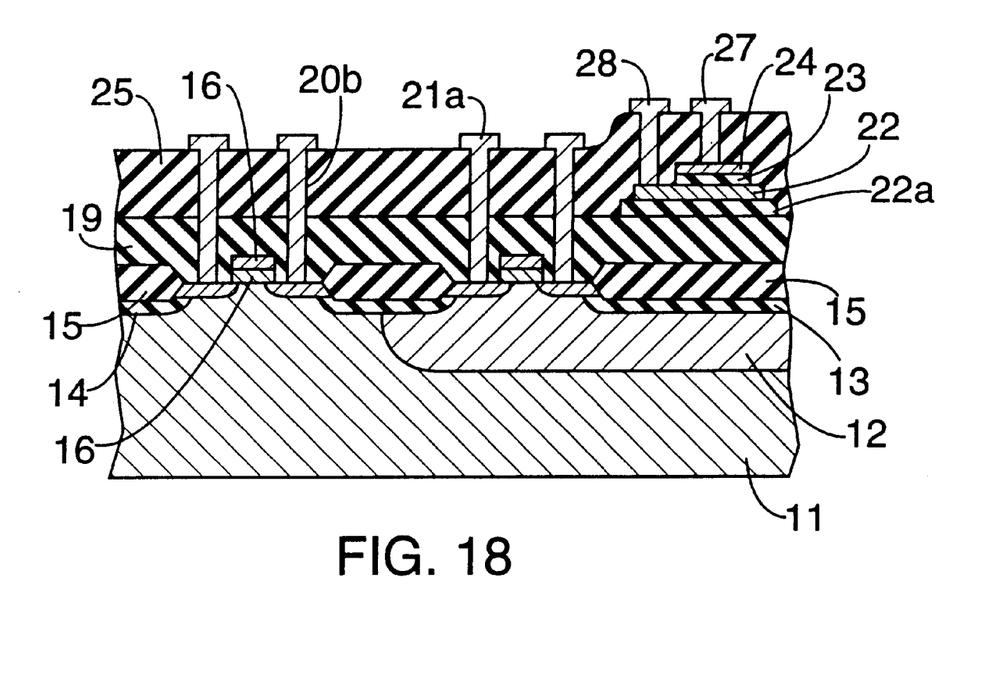
FIG. 18 is a cross sectional view of a semiconductor device having a capacitor formed on a silicon nitride film.
Figure 19:
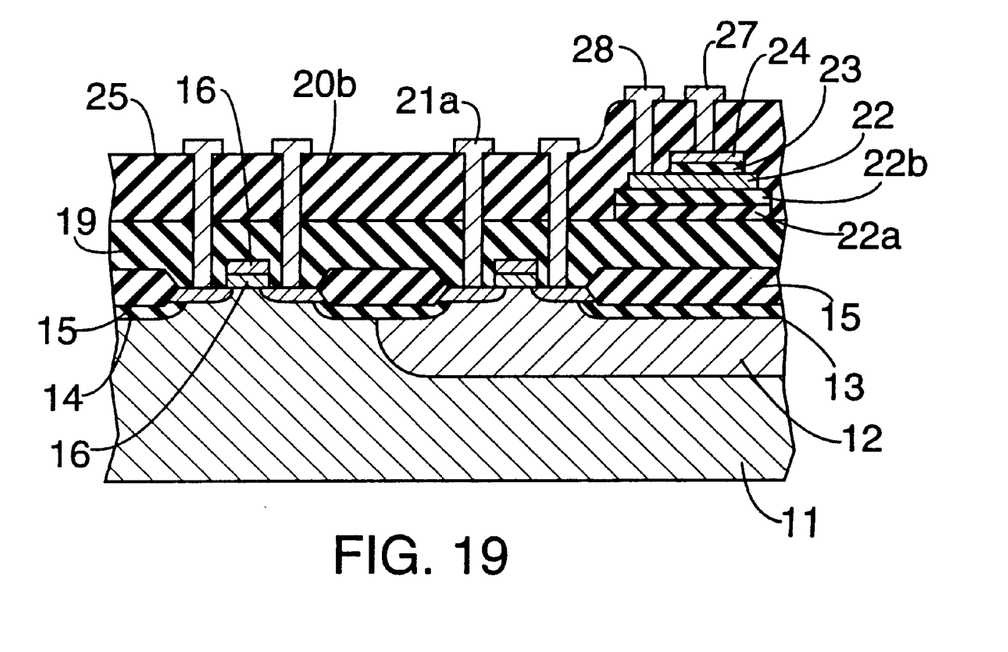
FIG. 19 is a cross sectional view of a semiconductor device having a capacitor formed on a multilayer film.

Moreover, in Embodiments 1 through 4 for example as shown in FIG. 18 and FIG. 19, it is preferable to form a silicon nitride 22a film or a multilayer film of silicon nitride 22a film and silicon oxide film 22b beneath the bottom electrode 22, and therefore when the dielectric film is heated at high temperature, the transistors and other parts composing the integrated circuit will not be contaminated. Besides, after the heat treatment, by patterning the silicon nitride film 22a or the multilayer film of silicon nitride film 22a and silicon oxide film 22b nearly in the same shape as, i.e. substantilly coextensive with, the bottom electrode 22, the stress of the silicon nitride film 22a applied on the interlayer insulating film 19 is reduced, aside from the above effects, so that the reliability may be improved.

Therefore, all modifications falling within the true spirit and scope of the invention should be embraced within the scope of the claims of the invention given herein.

We claim:

1. An apparatus for forming a dielectric film on a substrate comprising:

a source of electrically charged course and fine particulates containing elements for composing said dielectric film;

an injection port connected to said source;

a dielectric film forming chamber for receiving said electrically charged particulates through said injection port;

a substrate holder within said chamber for supporting said substrate; said substrate holder positioned a predetermined distance away from said injection port; and an electrode within said chamber for attracting said electrically charged particulates to said substrate to form said dielectric film thereon;

whereby only said fine particulates are deposited on the substrate to form the dielectric film thereon.

2. The apparatus of claim 1, wherein said source of electrically charged particulates includes means for pulverizing a substance containing elements for composing said dielectric film to form particulates, and means for injecting said particulates into said chamber.

3. The apparatus of claim 2, wherein said source of electrically charged particulates further comprises a charging electrode for forcing said particulates to become electrically charged.

4. The apparatus of claim 1, wherein said electrode is in the form of a grid.

5. The apparatus of claim 2, wherein said means for injecting includes a gas feed port for feeding carrier gas such that said electrically charged particulates move through said injection port by becoming entrained in said carrier gas.

6. The apparatus of claim 5, further comprising a gas exhaust port and an exhaust pump.

7. The apparatus of claim 1, wherein said dielectric film is for a capacitor on a semiconductor substrate.

8. An apparatus for forming a dielectric film for a capacitor on a semiconductor substrate comprising:

(A) a source of electrically charged particulates, comprising:

(1) means for pulverizing a substance containing elements for forming a dielectric film into particulates, said particulates comprised of coarse particulates and fine particulates;

(2) an injection port;

(3) means for injecting said particulates through said injection port, said means for injecting connected to said means for pulverizing; and (3) means for charging said particulates to an electrical potential having a first polarity;

(B) a dielectric film-forming chamber connected to said source of electrically charged particulates through said injection port for receiving said particulates;

(C) an attracting electrode mounted in said chamber and having a polarity opposite to said first polarity for attracting said electrically charged particulates; and (D) a substrate holder mounted in said chamber for supporting the semiconductor substrate, said substrate holder positioned a predetermined distance away from said injection port such that only said fine particulates are deposited on the semiconductor substrate to form the dielectric film thereon.

9. The apparatus of claim 8, wherein said means for charging said particulates comprises a charging electrode for causing said particulates to become electrically charged.

10. The apparatus of claim 8, wherein said attracting electrode is in the form of a grid.

11. The apparatus of claim 8, wherein said means for injecting further includes a gas feed port for feeding carrier gas which causes said electrically charged particulates to move through said injection port by becoming entrained in said carrier gas.

12. The apparatus of claim 11, further comprising a gas exhaust port and an exhaust pump.

* * * * *